United States Patent [19]

Mori

[11] Patent Number: 4,945,266

[45] Date of Patent: Jul. 31, 1990

[54] COMPOSITE SEMICONDUCTOR DEVICE

[75] Inventor: Satoshi Mori, Itami, Japan

[73] Assignee: Mitsubishi Denki Kabushiki Kaisha, Tokyo, Japan

[21] Appl. No.: 262,997

[22] Filed: Oct. 26, 1988

[30] Foreign Application Priority Data

Nov. 18, 1987 [JP] Japan ................................ 62-292707
Dec. 3, 1987 [JP] Japan ................................ 62-308081

[51] Int. Cl.$^5$ ............ H03K 17/60; H03K 3/35/17/72
[52] U.S. Cl. ..................................... 307/570; 307/305;
307/631; 307/633; 307/638; 307/639
[58] Field of Search ............... 307/570, 305, 631, 633, 307/638-639

[56] References Cited

U.S. PATENT DOCUMENTS

| 4,663,547 | 5/1987 | Baliga et al. | 307/570 |
| 4,717,849 | 1/1988 | Shigekane | 307/570 |
| 4,768,075 | 8/1988 | Broich et al. | 307/570 |

FOREIGN PATENT DOCUMENTS 3700071 9/1987 Fed. Rep. of Germany.

OTHER PUBLICATIONS

"Bipolar-FET Combinational Power Transistors for Power Conversion Applications", Dan Y. Chen and Shaoan A. Chin, CH1855-6/1983, IEEE, pp. 514-519.
"A New 100A, 1000 V Dual Cascode BIMOS Power Module for High Power and High Frequency Inverter Application", Y. Kamitani, G. Majumdar, H. Yamaguchi and S. Mori, PCI, Oct. 1986, Proceedings pp. 143-154.
Elektronik 8/22, Apr. 1983, pp. 55-56.
Siemens Components 25 (1987), Heft 6, pp. 221-224.

*Primary Examiner*—Stanley D. Miller
*Assistant Examiner*—Margaret R. Wambach
*Attorney, Agent, or Firm*—Oblon, Spivak, McClelland, Maier & Neustadt

[57] ABSTRACT

A static induction thyristor and a power MOSFET are connected is series to construct a composite semiconductor device. The composite semiconductor device is turned ON/OFF in response to signals applied to gates of the static induction thyristor and power MOSFET. Power consumption can be decreased because of the low ON state resistance of the static induction thyristor. Further, a driving current can be decreased since both the static induction thyristor and the power MOSFET are voltage driving type elements, to further decrease the power consumption. Still further, a composite semiconductor device having a high breakdown voltage can be easily implemented by increading the channel width of the static induction thyristor.

17 Claims, 6 Drawing Sheets

COMPOSITE SEMICONDUCTOR DEVICE

BACKGROUND OF THE INVENTION

1. Field of the Invention

The present invention relates to a composite semiconductor device for use in high speed switching, which has high breakdown voltage and large current capacity.

2. Description of the Background Art

FIG. 1 is a circuit diagram showing a cascode BiMOS (Bipolar and MOSFET combination) circuit as an example of a conventional power composite semiconductor device, wherein an NPN bipolar transistor Q1 and an N channel enhancement power MOS (metal-oxide-semiconductor) FET (field effect transistor) 2 are connected in series. As the bipolar transistor Q1, an element having a high breakdown voltage and large current capacity is used. An emitter of the bipolar transistor Q1 is connected to the drain of the power MOSFET 2. As the power MOSFET 2, an element having a low breakdown voltage of approximately 50V and large current capacity is used. A flywheel diode D1 for high frequency has a cathode connected to the collector C of the bipolar transistor Q1 and an anode connected to the source S of the power MOSFET 2. The bipolar transistor Q1 and the power MOSFET 2 are turned ON/OFF in response to levels of signals applied to the base B of the bipolar transistor Q1 and the gate G1 of the power MOSFET 2, so that the BiMOS circuit 1 is turned ON/OFF.

In the operation of the BiMOS circuit 1 shown in FIG. 1, positive and ground potentials are applied to the collector C of the bipolar transistor Q1 and the source S of the power MOSFET 2, respectively. When positive voltages are applied to the base B of the bipolar transistor Q1 and the gate G1 of the power MOSFET 2, both the transistors Q1 and 2 are turned ON and thus the BiMOS circuit 1 is turned ON. If the base B of the bipolar transistor Q1 is so biased that the BiMOS circuit 1 can be turned ON in response to only the signal to the gate G1 of the power MOSFET 2, the turn ON time of the BiMOS circuit 1 depends on only the turn ON time of the power MOSFET 2. In such a case, the tune ON time of the BiMOS circuit I can be extremely decreased.

To turn OFF the BiMOS circuit I, the positive voltages applied to the base B of the bipolar transistor Q1 and the gate G1 of the power MOSFET 2 are removed. In a turn OFF transition, the power MOSFET 2 is turned OFF prior to the turn OFF of the bipolar transistor Q1. As a result, the emitter of the bipolar transistor Q1 becomes a cut off state, so that residual carriers in the collector of the bipolar transistor Q1 are discharged through the base B of the bipolar transistor Q1. Thus, a breakdown voltage becomes equal to the emitter-open collector-to-base maximum voltage $V_{CBO}$ of the bipolar transistor Q1 due to the emitter cut off state of the bipolar transistor Q1 in the turn OFF transition. Thus, a circuit having a breakdown voltage higher than the ordinary breakdown voltage, i.e., base-open collector-to-emitter maximum voltage $V_{CEO}$, of the bipolar transistor Q1 can be implemented.

In the BiMOS circuit 1 shown in FIG. 1, the bipolar transistor Q1 is used in a single stage structure because of high speed sWitching, and hence the current amplification factor thereof is small. Therefore, it is necessary to increase the capacity of a base driving circuit of the bipolar transistor Q1 to supply a large base current to the bipolar transistor Q1, in order to conduct a large current through the BiMOS circuit This results in the increase of power consumption. Further, the ON state resistance of the bipolar transistor Q1 is relatively large, and hence the power consumption of the bipolar transistor Q1 is disadvantageously large in the ON state of the BiMOS circuit 1.

FIG. 2 is a circuit diagram showing another conventional cascode BiMOS circuit which includes an N channel enhancement power MOSFET 3 for driving a bipolar transistor Q1 in FGT (FET gated transistor) structure and a zener diode ZD1 for rapidly discharging residual carriers in the collector of the bipolar transistor Q1 upon the emitter cut off state of the bipolar transistor Q1. The zener diode ZD1 has an anode connected to the source S of a power MOSFET 2 and a cathode connected to the base B of the bipolar transistor Q1. The zener diode ZD1 has a zener voltage of several volts. The power MOSFET 3 has a gate connected to the gate G1 of the power MOSFET 2, a drain connected to the collector C of the bipolar transistor Q1 and a source connected to the base B of the bipolar transistor Q1. As the power MOSFET 3, an element of the type of high breakdown voltage and middle current capacity is used. Other structures are the same as those of the circuit shown in FIG. 1.

In the operation of the BiMOS circuit 1 shown in FIG. 2, positive and ground potentials are applied to the collector C of the bipolar transistor Q1 and the source S of the power MOSFET 2, respectively, as is similar to the circuit of FIG. 1. When a positive voltage is applied to the gate G1, the power MOSFETs 2 and 3 are first turned ON. A base current is supplied to the base of the bipolar transistor Q1 through the power MOSFET 3, to turn ON the bipolar transistor Q1. Thus, the BiMOS circuit 1 is turned ON.

To turn OFF the BiMOS circuit I, the positive voltage applied to the gate G1 is removed. The power MOSFETs 2 and S are responsively turned OFF. and thus the bipolar transistor Q1 enters an emitter cut off state. Residual carriers in the collector of the bipolar transistor Q1 are discharged to the source S through the base B of the bipolar transistor Q1 and the zener diode ZD1 in a short period of time of several $\mu$s. As a result, the bipolar transistor Q1 is rapidly turned OFF. and hence the turn OFF time of the BiMOS circuit approaches that of the power MOSFET 2, to enable high speed switching.

In the circuit shown in FIG. 2, it is required to sufficiently increase the capacity of the power MOSFET 3 serving as a base driving circuit for the bipolar transistor Q1, for the same reason as in the circuit shown in FIG. 1. Further, power consumption is disadvantageously increased due to the ON state resistance of the bipolar transistor Q1 as is similar to the circuit of FIG. 1.

FIG. 3 is a circuit diagram showing still another conventional cascade BiMOS circuit disclosed in Electrical Society Technical Bulletin Part II, No. 249, "Trend of Self-Suppressing Type Power Semiconductor Device", p.60, June 1987. Referring to FIG. 3, a flywheel diode D1 is connected between the source and drain of a power MOSFET 2. A current transformer 4 is interposed on the line of a collector side of a bipolar transistor Q1 and has one end connected to the source S of the power MOSFET 2 and the other end connected to the base B of the bipolar transistor Q1 through a diode D3. A capacitor Cl is connected between the base B of the bipolar transistor Q1 and the source S of the power MOSFET 2. The collector of the bipolar transistor Q1 is connected to the base B of the bipolar transistor Q1 through a diode D4 and a resistor R. Other structures are the same as those of the circuit shown in FIG. 2.

In the operation of the circuit shown in FIG. 3, positive and ground potentials are applied to the collector C and the source S, respectively. When both the bipolar transistor Q1 and the power MOFET 2 are in an OFF state, the capacitor C1 is charged to the zener voltage of the zener diode ZD1. Upon application of a positive voltage to the gate G1 of the power MOSFET 2, the power MOSFET 2 is turned ON to lower the emitter voltage of the bipolar transistor Q1. When the base-to-emitter voltage of the bipolar transistor Q1 becomes larger than a predetermined value, the bipolar transistor Q1 is turned ON so that a collector current begins to flow. The current transformer 4 responsively induces a current which is in turn supplied to the base B of the bipolar transistor Q1 through the diode D3. Once the collector current beings to flow through the bipolar transistor Q1, the current transformer 4 continues to stably supply a base driving current to the base B of the bipolar transistor Q1. Thus, a BiMOS circuit 1 is turned ON.

When a negative voltage is applied to the gate G1 of the power MOSFET 2, the power MOSFET 2 is turned OFF. As a result, the bipolar transistor Q1 enters an emitter cut off state. Therefore, residual carriers in the collector of the bipolar transistor Q1 are discharged through the case B of the bipolar transistor Q1 and the zener diode ZD1, as is similar to the circuit shown in FIG. 2. Thus, the BiMOS circuit 1 is rapidly turned OFF.

The circuit shown in FIG. 3 has the bipolar transistor Q1 of a signal stage structure as is similar to the circuit shown in FIG. 1. Therefor, a base driving circuit is complicated as shown in FIG. 3, to supply a sufficiently large base current to the bipolar transistor Q1 in order to conduct a large current from the collector C of the bipolar transistor Q1 to the source S of the power MOSFET 2. Power consumption is disadvantageously increased because of the large capacity of the base driving circuit. Further, a circuit area for the base driving circuit is disadvantageously increased due to the complication of the base driving circuit, to increase a cost.

SUMMARY OF THE INVENTION

A composite semiconductor device in accordance with the present invention comprises, first and second power source terminals for receiving first and second power source potentials, respectively, first and second control signal input terminals for receiving first and second control signals, respectively, a static induction type element having a first electrode connected to the first power source terminal, a control electrode connected to the first control signal input terminal and a second electrode, and a MOS field effect transistor having a first electrode connected to the second electrode of the static induction type element, a second electrode connected to the second power source terminal and a control electrode connected to the second control signal input terminal.

Accordingly, it is an object of the present invention to provide a composite semiconductor device of low power consumption, low cost, high speed switching ability and high breakdown voltage.

These and other objects, features, aspects and advantages of the present invention will become more apparent from the following detailed description of the present invention when taken in conjunction with the accompanying drawings.

DETAILED DESCRIPTION OF THE EMBODIMENT

Figure 1:
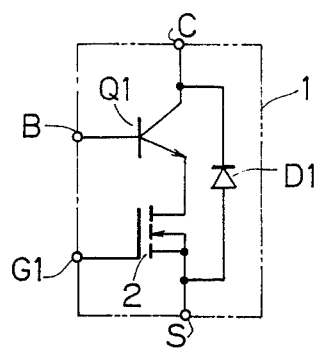
FIG. 1 to FIG. 3 are circuit diagrams showing conventional power composite semiconductor devices.
Figure 2:
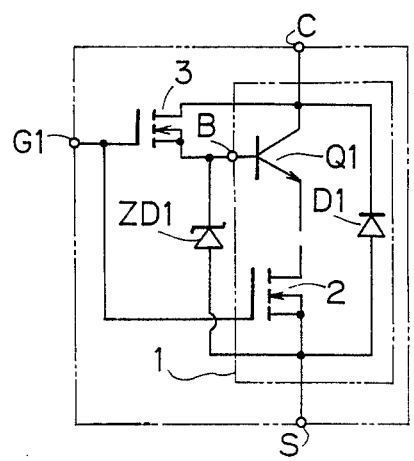
Figure 3:
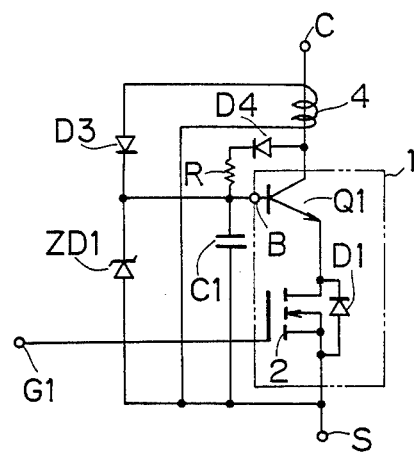
Figure 4:
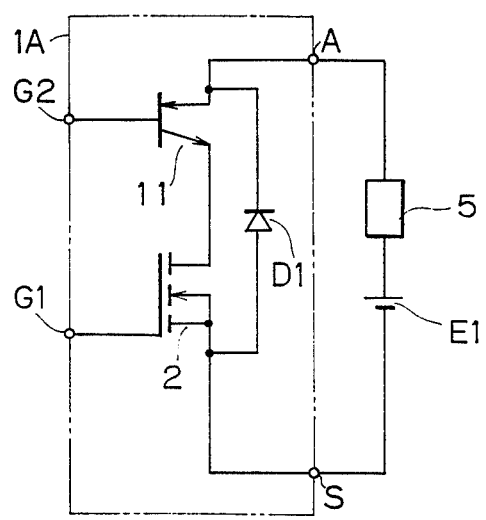
FIG. 4 is a circuit diagram showing an embodiment of a composite semiconductor device in accordance with the present invention.

FIG. 4 is a circuit diagram showing an embodiment of a composite semiconductor device in accordance with the present invention. Referring to FIG. 4, this composite semiconductor device comprises an N channel enhancement power MOSFET 2 having a relatively low breakdown voltage such as approximately 50V and a relatively low ON state resistance (high current capacity), a static induction thyristor (hereinafter referred to as an SI thyristor) 11 having a relatively high breakdown voltage and a relatively low ON state resistance (high current capacity) as hereinafter described and a flywheel diode D1. The cathode of the SI thyristor 11 is connected to the drain of the power MOSFET 2. The anode A of the SI thyristor 11 is connected to the positive side of a power source E1 through a load 5, and the source S of the power MOSFET 2 is connected to the negative side of the power source E1. The diode DI has a cathode connected to the anode A of the SI thyristor 11 and an anode connected to the source S of the power MOSFET 2.

Figure 5:
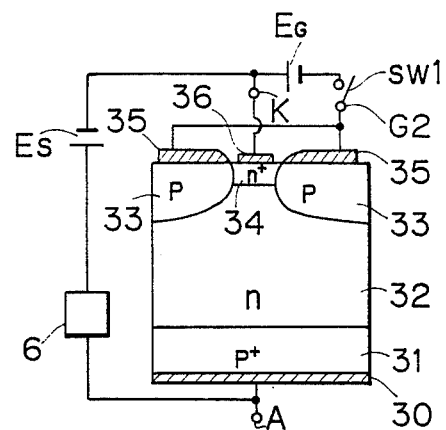
FIG. 5 is a cross-sectional view showing an SI thyristor employed in the present invention.
Figure 6:
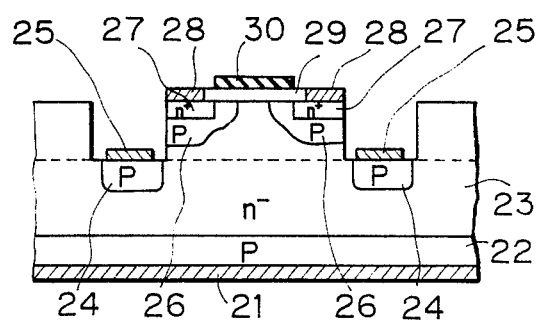
FIG. 6 is a cross-sectional view showing the composite semiconductor device shown in FIG. 4 integrated on one chip.

The SI thyristor 11 may have a structure shown in FIG. 6. FIG. 6 shows the general structure of a normally ON type SI thyristor. Referring to FIG. 5, a $p^+$ type layer 31 is provided on the back surface thereof with an anode electrode 30 which is connected to an anode terminal A. An n type layer 32 is formed on the $p^+$ type layer SI. P type gate layers 33 are formed in the peripheral portion of a surface of the n type layer 32. Gate electrodes 35, which are connected to a gate terminal G2, are formed on the p type gate layers 33. An $n^+$ type layer 34 is formed on the central portion of the surface of the n type layer 32. A cathode electrode 36, which is connected to a cathode anode terminal A and the cathode terminal K a load 6 and a power source $E_S$ are connected in series. The gate terminal G2 is connected to the cathode terminal K through a switch SW1 and a power source $E_G$.

In the operation of the SI thyristor shown in FIG. 5, when the switch SW1 is in an OFF state, positive and negative potentials are applied to the anode electrode A and the cathode electrode K from the power source $E_G$, respectively, so that a current flows through the $p^+$ type layer 31, the n type layer 32 and the $n^+$ type layer 34 in this sequence. When the switch SW1 is turned ON, a p-n junction defined by the p type gate layers 83 and the n and n+ type layers 32 and 34 are reversely biased. A depletion layer extends and pinches-off a channel surrounded by the p type gate layers 33, so that the SI thyristor is turned OFF.

In the case of a normally OFF type SI thyristor, a forward voltage must be applied across gate and cathode terminals to turn OFF the SI thyristor.

In general, an SI thyristor can be increased in breakdown voltage to the extent of approximately 700V, even if a channel width is very small, such as several $\mu m$. Therefore, an SI thyristor having a higher breakdown voltage than 700 V can be easily implemented by increasing the channel width. Further, in general, an SI thyristor has a low ON state resistance and, therefore, small power consumption.

The operation of the circuit shown in FIG. 4 will now be described. It is first assumed that the SI thyristor is of a normally OFF type. To turn ON the composite semiconductor device 1A, positive voltages are applied to the gate G1 of the power MOSFET 2 and the gate G2 of the SI thyristor 11. In response to this, the power MOSFET 2 and the SI thyristor 11 are turned ON so that a current flows from the power source E1 through the load and the composite semiconductor device 1A. When the positive voltages applied to the gates G1 and G2 are removed, the power MOSFET 2 and the SI thyristor 11 are turned OFF, so that the composite semiconductor device 1A is turned OFF.

It is then assumed that the SI thyristor is a normally ON type SI thyristor To turn ON the composite semiconductor device 1A, positive and ground potentials are applied to the gate G1 of the power MOSFET 2 and the gate G2 of the SI thyristor 11, respectively. In response to this. the power MOSFET 2 and the SI thyristor 11 are turned ON, so that a current flows from the anode A to the source S as is similar to the above case. When negative voltages are applied to the gates G1 and G2, the power MOSFET 2 and the SI thyristor 11 are turned OFF. Thus, the composite semiconductor device is turned OFF.

In the aforementioned embodiment, the bipolar transistor Q1 employed in the conventional circuit shown in FIG. is replaced by the SI thyristor 11 which is an element of voltage driving type having a relatively low ON state resistance, and hence power consumption can be extremely decreased. Further, both the power MOSFET 2 and the SI thyristor 11 are majority carrier elements which cause no residual carriers in the time of turn OFF, and hence a turn OFF time is extremely decreased. Still further, a device having a breakdown voltage of approximately 1000V similar to the conventional BiMOS circuit can be implemented, by increasing the channel width of the SI thyristor 11 to the extent of approximately 10$\mu m$.

FIG. 6 is a cross-sectional view showing an example of the structure Of a composite semiconductor device according to the present invention, wherein the composite semiconductor device shown in FIG. 4 comprising the SI thyristor 11 and the power MOSFET 2 is integrated on one chip. Referring to FIG. 6, a p type layer 22 is provided on the back and top surfaces thereof with an anode electrode 21 and an n− type layer 23 having recesses, respectively. Deep p type layers 24 are formed in bottom surfaces of the recesses of the n− type layer 23 by selective diffusion, for example. Gate electrodes 25 are formed on the p type layers 24 and thus an SI thyristor is formed.

P type layers 26 are formed by selective diffusion in the peripheral portion of a surface of the n− type layers 26 surrounded by the recesses. N+ layers 2? are selectively formed by diffusion in the surfaces of the p type layers 26. Source electrodes 28 are formed on the n+ type layers 27 and a gate insulation film 29 is provided on the portion of the surface of the n− type layer 23 between the p type layers 26. A gate electrode 30 is formed on the gate insulation film 29 and thus a power MOSFET is formed. Thus, a complete composite semiconductor device having an SI thyristor and a power MOSFET integrated on one chip is implemented.

Figure 7:
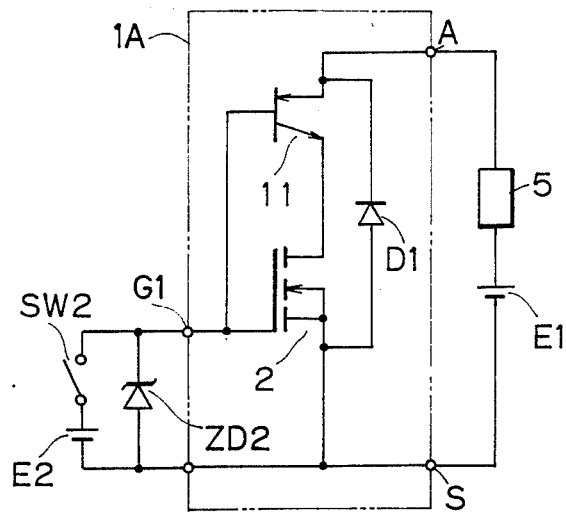
FIG. 7 to FIG. 10 are circuit diagrams showing other embodiments of the composite semiconductor device in accordance with the present invention.

FIG. 7 is a circuit diagram showing another embodiment of the composite semiconductor device in accordance with the present invention. In this embodiment, gates G1 and G2 in the circuit shown in FIG. 4 are connected in common, a zener diode ZD2 is newly provided to protect a power MOSFET 2, and a switch SW2 and a power source E2 are newly provided to control ON and OFF states of a composite semiconductor device 11A with a single signal through a common gate G1, as compared with the circuit shown in FIG. 4. The zener diode ZD2 has a cathode connected to the gate G1 of the power MOSFET 2 and an anode connected to the source S of the power MOSFET 2. The gate G1 is connected to the positive side of the power source E2 through the switch SW2 and the source S is connected to the negative side of the power source E2. Other structures are the same as those of the circuit shown in FIG. 4.

Assuming that an SI thyristor is of a normally OFF type, the operation of the circuit shown in FIG. 7 will now be described. When the switch SW2 is turned ON, the posItIve voltage of the power source E2 is applied to the gate G1. In response to this, the BI thyristor 11 and the power MOSFET 2 are turned ON. Thus the composite semiconductor device 1A is turned ON, so that a current flows from a power source E1 through a load 5 and the composite semiconductor device 1A. When the switch SW2 is turned OFF, the SI thyristor 11 and the power MOSFET 11 are turned OFF, and thus the composite semiconductor device 1A is turned OFF.

In the case that the SI thyristor 11 is of a normally ON type, a positive voltage is also applied to the gate G1 upon turning ON of the switch SW2 as is similar to the above. In response to this, the power MOSFET 2 is turned ON. As to the SI thyristor 11, it keeps in an ON state since it is of a normally on type. Thus the composite semiconductor device 1A is turned ON upon conduction of the power MOSFET 2. When the switch SW2 is turned OFF, the power MOSFET 2 is turned OFF although the SI thyristor 11 of a normally ON type keeps in an ON state. Thus, the composite semiconductor device 1A is turned OFF upon neonconduction of the power MOSFET 2.

According to this embodiment, the composite semiconductor device 1A can be easily controlled with a single signal. As a result, a driving circuit for the composite semiconductor device 1A can be simplified in structure to decrease a cost.

Figure 8:
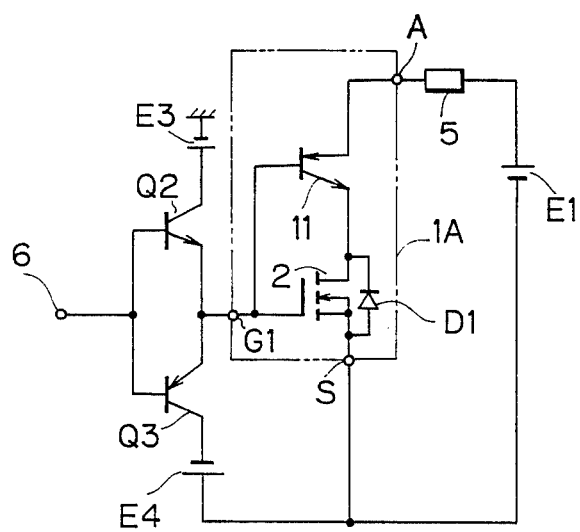

FIG. 8 is a circuit diagram showing still another embodiment of the composite semiconductor device in accordance with the present invention. This composite semiconductor device is also adapted to control with a single signal. Referring to FIG. 8, an NPN transistor Q2 has a collector grounded through a power source E3, an emitter connected to a gate G1 and a base connected to a control signal input terminal 6. A PNP transistor Q3 has a collector connected to a source S through a power source E4, an emitter connected to the gate G1 and a base connected to the control signal input terminal 6. Thus the NPN and PNP transistors form complementary transistors. A flywheel diode D1 is connected between the drain and source of a power MOSFET 2. Other structures are the same as those of the circuit shown in FIG. 7.

Assuming that an SI thyristor 11 is of a normally OFF type, the operation of the circuit shown in FIG. 8 will now be described. When a positive voltage is applied to the control signal input terminal 6, the transistor Q2 is turned ON and the transistors Q3 is turned OFF, so that the positive voltage of the power source E3 is applied to the gate G1 through the transistor Q2. In response to this, both the power MOSFET 2 and the SI thyristor 11 are turned ON, so that a current flows across an anode A and the source S. Thus, the composite semiconductor device 1A is turned ON. When a negative voltage is applied to the control signal input terminal 6, the transistor Q2 is turned OFF and the transistor Q3 is turned ON, so that the negative voltage of the power source E4 is is applied to the gate G1. In response to this, both the power MOSFET 2 and the SI thyristor 11 are turned OFF, so that the current flowing across the anode A and the source S is cut off. Thus the composite semiconductor device 1A is turned OFF.

In the case where the SI thyristor 11 is of a normally ON type, when a positive voltage is applied to the control signal input terminal 6, the gate G1 receives a positive voltage as hereinbefore described. In response to this, the power MOSFET 2 is turned ON. The normally ON type SI thyristor 11 keeps in an ON state unless a negative voltage is applied to the gate thereof. Thus, the composite semiconductor device 1A is turned ON. When a negative voltage is applied to the control signal input terminal 6, the gate G1 receives negative voltage as hereinbefore described. In response to this, both the power MOSFET 2 and the SI thyristor 11 are turned OFF, and thus the composite semiconductor device is turned OFF. According to this embodiment, advantages similar to those of the embodiment illustrated in FIG. 7 are obtained.

Figure 9:
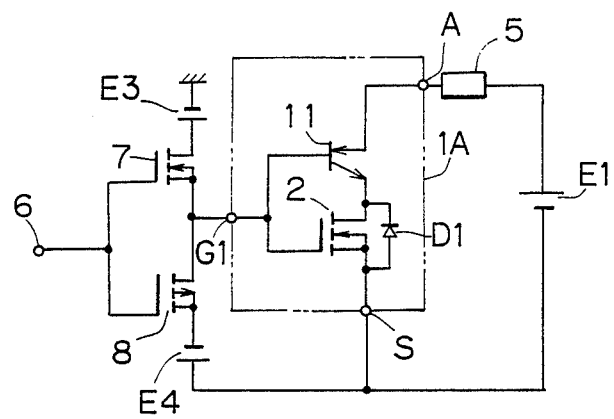

FIG. 9 is a circuit diagram showing still another embodiment of the composite semiconductor device in accordance with the present invention. In this embodiment, the transistors Q2 and Q3 in the circuit shown in FIG. 8 are replaced by an N channel power MOSFET 7 and a P channel power MOSFET 8. Other structures and operation are the same as those of the circuit shown in FIG. 8. According to this embodiment, the power MOSFETs and B which are voltage driving type elements are provided in place of the transistors Q2 and Q3, and hence power consumption can further be decreased as compared with the circuit shown in FIG. 8.

Figure 10:
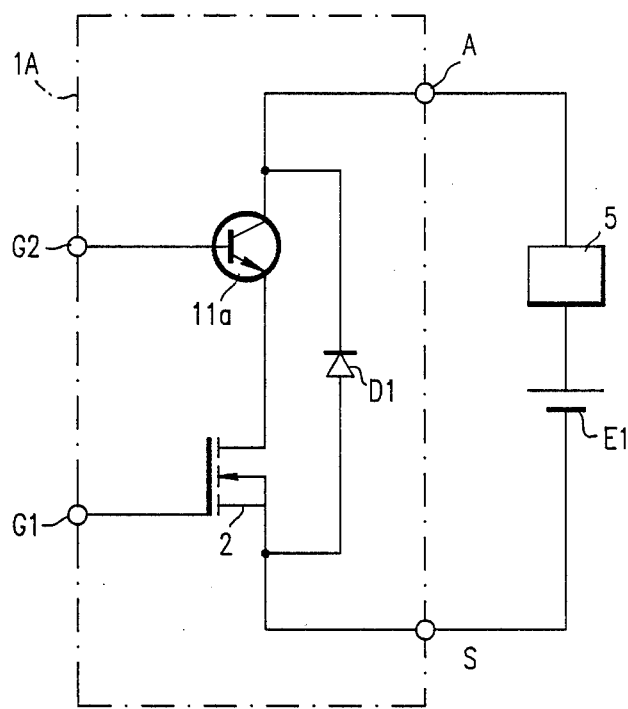

In the embodiments illustrated in FIG. 4 and FIG. 7, the N channel power MOSFET 2 may be replaced by a p channel power MOSFET. In this case, it is necessary to reverse a voltage level applied to the gate G1 of the power MOSFET 2 in FIG. 4 and the polarity of the power source E2 in FIG. 7. Further, the SI thyristor 11 may be replaced by other static induction type elements such as a static induction transistor 11a as shown in FIG. 10 to attain the same effects as those of the aforementioned embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A composite semiconductor device, comprising;
   first and second power source terminals for receiving first and second power source potentials, respectively;
   first and second control signal input terminals for receiving first and second control signals, respectively;
   a static induction type element having a first electrode connected to said first power source terminal, a control electrode connected to said first control signal input terminal and a second electrode;
   a MOS field effect transistor having a first electrode connected to said second electrode of said static induction type element, a second electrode connected to said second power source terminal and a control electrode connected to said second control signal input terminal; and
   a diode having an anode connected to the second electrode of said MOS field effect transistor and a cathode connected to one of the non-control electrodes of said static induction type element.

2. A composite semiconductor device in accordance with claim 1, wherein:
   said first and second control signal input terminals include a common control signal input terminal for receiving a common control signal as said first and second control signals,
   said composite semiconductor device further comprising a control signal generating circuit connected to said common control signal input terminal for generating said common control signal,
   said control electrodes of said static induction type element and said MOS field effect transistor being connected to said common control signal input terminal in common.

3. A composite semiconductor device in accordance with claim 2, wherein
   said control signal generating circuit comprises;
   a switch, and
   a first power source connected in series with said switch, the series connection of said switch and first power source being connected between said common control signal input terminal and said second power source terminal, for providing a first predetermined potential.

4. A composite semiconductor device in accordance with claim 2, wherein
   said control signal generating circuit comprises;
   first and second power sources for providing first and second predetermined potential, respectively,
   a third control signal input terminal for receiving a third control signal,
   a first conductivity type first transistor having a first electrode connected to said first power source, a second electrode connected to said common control signal input terminal and a control electrode connected to said third control signal input terminal, and
   a second conductivity type second transistor having a first electrode connected to said common control signal input terminal, a second electrode connected to said second power source and a control electrode connected to said third control signal input terminal, thereby said third control signal being converted into said common control signal through said first and second transistor, to be received by said common control signal input terminal.

5. A composite semiconductor device in accordance with claim 4, wherein said first transistor is an NPN transistor and said second transistor is a PNP transistor.

6. A composite semiconductor device in accordance with claim 4, wherein said first transistor is an N channel field effect transistor and said second transistor is a P channel field effect transistor.

7. A composite semiconductor device in accordance with claim 4, wherein one of said first and second predetermined potential is a positive potential and the other is a negative potential.

8. A composite semiconductor device in accordance with claim 1, wherein said static induction type element includes a static induction thyristor.

9. A composite semiconductor device in accordance with claim 8, wherein said static induction thyristor includes a normally OFF type static induction thyristor.

10. A composite semiconductor device in accordance with claim 8, wherein said static induction thyristor includes a normally ON type static induction thyristor.

11. A composite semiconductor device in accordance with claim 1, wherein said static induction type element includes a static induction thyristor.

12. A composite semiconductor device in accordance with claim 1, wherein said MOS field effect transistor includes an N channel MOS field effect transistor.

13. A composite semiconductor device in accordance with claim 1, wherein said diode has a cathode 14. A composite semiconductor device in accordance with claim 3, further comprising a zener diode having a cathode connected to said common control signal input terminal and an anode connected to said second power source terminal.

15. A composite semiconductor device in accordance with claim 1, wherein said static induction type element has a relatively high breakdown voltage and a relatively low ON state resistance.

16. A composite semiconductor device in accordance with claim 1, wherein said MOS field effect transistor has a relatively low breakdown voltage and a relatively low ON state resistance.

17. A composite semiconductor device in accordance with claim 1, wherein said diode has a cathode connected to said second electrode of said static induction type element.

* * * * *